US 6,606,005 B2

(12) United States Patent
Chang

(10) Patent No.: US 6,606,005 B2
(45) Date of Patent: Aug. 12, 2003

(54) PHASE-LOCKED LOOP CIRCUIT CAPABLE OF ADJUSTING THE FREQUENCY RANGE OF SPREAD SPECTRUM CLOCK

(75) Inventor: Horng-Der Chang, Hualien (TW)

(73) Assignee: Realtek Semiconductor Corp. (TW)

( * ) Notice: Subject to any disclaimer, the term of this patent is extended or adjusted under 35 U.S.C. 154(b) by 0 days.

(21) Appl. No.: 10/044,120

(22) Filed: Jan. 11, 2002

(65) Prior Publication Data

US 2002/0145478 A1 Oct. 10, 2002

(30) Foreign Application Priority Data

Feb. 26, 2001 (TW) .......................................... 90104437

(51) Int. Cl.[7] .............................................. H03B 29/00
(52) U.S. Cl. .................. 331/78; 331/17; 331/2
(58) Field of Search .................. 331/17, 25, 2, 331/46, 78, 34, 1; 327/156, 157, 159; 375/374, 375, 376

(56) References Cited

U.S. PATENT DOCUMENTS 5,389,898 A * 2/1995 Taketoshi et al. .............. 331/2
5,657,359 A * 8/1997 Sakae et al. ................. 375/376
6,181,213 B1 * 1/2001 Chang ......................... 331/34

* cited by examiner

Primary Examiner—Henry Choe
(74) Attorney, Agent, or Firm—Raymond Sun

(57) ABSTRACT

A circuit includes a first voltage-controlled oscillator (VCO) that generates a feedback clock. The circuit further includes a phase frequency detector, a charge pump and a loop filter that together receive a reference clock and the feedback clock, and in response thereto, generates a first voltage signal. The circuit further includes a timing generator that generates a control signal having varying periods, and a voltage modulator that receives the first voltage signal and the control signal, and in response thereto, generates a second voltage signal and a third voltage signal. The second voltage signal is provided to the first VCO. The circuit also includes a second VCO that receives the third voltage signal and which outputs a spread spectrum clock.

18 Claims, 8 Drawing Sheets sw(1)~sw(N)

sw(n+1)~sw(2N)

US 6,606,005 B2

PHASE-LOCKED LOOP CIRCUIT CAPABLE OF ADJUSTING THE FREQUENCY RANGE OF SPREAD SPECTRUM CLOCK

BACKGROUND OF THE INVENTION

1. Field of the Invention

The present invention relates to a phase-locked loop circuit, and in particular, to a phase-locked loop circuit capable of adjusting the frequency range of a spread spectrum clock.

2. Description of the Prior Art

All electronic equipment inherently generate electromagnetic interference (EMI) of one sort or another. EMI can cause physical harm to humans, and can have a negative impact on the other components of the computer. For example, EMI can cause the other components to experience instantaneous high voltage. The clock generator on the motherboard of a computer is always the main source of EMI in the computer. As a result, in order to suppress the EMI, a phase-locked loop with a spread spectrum circuit is often used to suppress the EMI.

FIG. 1A is a primary block diagram showing a conventional phase-locked loop (PLL) circuit. The PLL circuit 100 includes a N-divider 102, a M-divider 104, a phase frequency detector 106, a charge pump 108, a loop filter 110, and a voltage-controlled oscillator 112.

The N-divider 102 receives the reference signal with frequency $F_{ref}$, divides the frequency $F_{ref}$ by N, and outputs the signal $F_{ref}/N$. The M-divider 104 receives the feedback signal $F_{vco}$ with the frequency $F_{vco}$ outputted from the voltage-controlled oscillator 112, divides the frequency $F_{vco}$ by M, and outputs the signal $F_{vco}/M$. $F_{ref}/N$ is the external clock signal, while $F_{vco}/M$ is the internal clock signal. The phase frequency detector 106 detects both the frequency difference and phase difference between the signals $F_{ref}/N$ and $F_{vco}/M$, and outputs control signals "UP" and "DN" (i.e., down). When the phase of $F_{vco}/M$ lags behind that of the $F_{ref}/N$, the phase frequency detector 106 will enable the control signal "UP". Inversely, when the phase of signal $F_{ref}/N$ lags behind that of the signal $F_{vco}/M$, the phase frequency detector 106 will enable the control signal "DN". The charge pump 108 and the loop filter 110 are used for transforming the control signals "UP" and "DN" outputted from the phase frequency detector 106 into the control voltage $V_c$. When the control signal "UP" of the phase frequency detector 106 is enabled, the charge pump 108 generates a current $I_{ch}$ that flows into the loop filter 110 so as to increase the voltage $V_c$. Inversely, when the control signal "DN" of the phase frequency detector 106 is enabled, current is drained from the charge pump 108, so that the voltage $V_c$ outputted from the loop filter 110 will decrease. The voltage-controlled oscillator 112 generates the feedback signal $F_{vco}$ which has a frequency $F_{vco}$ that varies according to the output voltage $V_c$ from the loop filter 110. When the gain of the voltage-controlled oscillator is greater than 0 and $V_c$ increases, the frequency $F_{vco}$ will increase. On the other hand, when the gain of the voltage-controlled oscillator is smaller than 0 and $V_c$ increases, the frequency $F_{vco}$ will decrease. This process continues until, ideally, $F_{ref}/N$ is equal to $F_{vco}/M$. In the following description, the gain of the voltage-controlled oscillator is supposed to be greater than 0. Therefore, when the phase-locked loop circuit is stable, the relationship between $F_{vco}$ and $F_{ref}$ thereof is represented by the following equation:

$$F_{vco}/M = F_{ref}/N$$

which translates to:

$$F_{vco} = F_{ref} * M/N \quad (1)$$

From equation (1), it is noted that only the values of the divisors, M and N, need to be controlled in order to control the value of $F_{vco}$. In the above-mentioned application, however, when the PLL is stable, $F_{vco}$ is a constant frequency. When the constant frequency is transmitted on the trace in the motherboard, interference sources of this frequency and its harmonic component will be radiated. Therefore, the EMI specification (i.e., that the density of $f_c$ and its harmonics be within a certain range) cannot be met. As shown in FIGS. 1B(i) and 1B(ii), the amplitude at the frequency $F_c$ exceeds the EMI specification. The interference level can be decreased if the PLL structure can be modified to uniformly spread out the energy of the signal $F_{vco}$ within a predetermined range.

FIG. 2A shows an ideal spread spectrum on time domain and frequency domain. In this graph, the frequency of the signal $F_{vco}$ periodically rises and falls, with the frequency $F_c$ as the center between the frequency ranges of $f_1$ and $f_2$. FIG. 2B shows the relationship between the amplitude and frequency at the signal $F_{vco}$ of FIG. 2A, and the amplitude falls within the EMI specification. Usually, the oscillating frequency of the voltage-controlled oscillator may be expressed by the following equation:

$$F_{vco} = F_0 + K_{vco}(V_c - V_0) \quad (2)$$

wherein $F_{vco}$ is the oscillating frequency of the voltage-controlled oscillator, $F_0$ is the free running frequency when $V_c = V_0$, $K_{vco}$ is the slope of the voltage-controlled oscillator, which unit is Hz/V, $V_c$ is the control voltage inputted to the voltage-controlled oscillator, and $V_o$ is the threshold voltage of the voltage-controlled oscillator. The frequency of the voltage-controlled oscillator can be controlled only when $V_c$ is greater than $V_o$. Therefore, if the PLL can control the $V_c$ to vary linearly and periodically, the frequency $F_{vco}$ will vary linearly and periodically in correspondence with $V_c$ to thereby achieve the effects of spectrum spreading.

To achieve the above effect, some conventional applications have added another loop to control the $V_c$ in the PLL. In this case, the frequency $F_{vco}$ can vary linearly and periodically to achieve the effect of spectrum spreading. This method, however, has some disadvantages: (1) the circuit of the PLL becomes more complicated, (2) the entire structure tends to be unstable, and (3) the range of the spread spectrum is not easily controlled.

U.S. Pat. No. 5,610,955 discloses another attempt at achieving spread spectrum, which uses a method for periodically changing the M/N value in order to achieve the purpose of spectrum spreading. However, the disadvantage of this method is that the spread spectrum is not uniform. In other words, when the frequency reaches the upper and lower bounds, the frequency is constant within a period of time. This effect is illustrated in FIGS. 3A and 3B, where the outputted clocks $F_{vco}$ may jut at frequencies $f_1$ and $f_2$ (see FIG. 3B) and exceed the EMI specification.

SUMMARY OF THE INVENTION

In view of the above-mentioned problems, it is therefore an object of the present invention to provide a PLL circuit that is capable of adjusting the range of spread spectrum, eliminating the jutting phenomenon on the frequency spectrum, and spreading the energy over a wider range.

To accomplish the objectives of the present invention, there is provided a circuit that includes a first voltage-controlled oscillator (VCO) that generates a feedback clock. The circuit further includes a phase frequency detector, a charge pump and a loop filter that together receive a reference clock and the feedback clock, and in response thereto, generates a first voltage signal. The circuit further includes a timing generator that generates a control signal having varying periods, and a voltage modulator that receives the first voltage signal and the control signal, and in response thereto generates a second voltage signal and a third voltage signal. The second voltage signal is provided to the first VCO. The circuit also includes a second VCO that receives the third voltage signal and which outputs a spread spectrum clock.

Since the present invention utilizes an FM/AM timing generator to control the voltage modulator, the PLL of the present invention realizes several advantages:

(1) since only one loop is used, the PLL circuit is simple and easy to maintain stable;
(2) the frequency range of the spread spectrum clock can be quantified, and the frequency of the spread spectrum clock can be controlled in a programmable way;
(3) since the time of frequency variation can be quantified and is programmable, the energy can be spread over a much wider range; and
(4) since the frequency of the spread spectrum clock varies periodically, there will be no constant frequency, no surge will be generated, and the spread spectrum clock will be uniform.

BRIEF DESCRIPTION OF THE DRAWINGS

These and other objects and advantages of the present invention will become apparent by reference to the following description and accompanying drawings wherein:

FIG. 1B(ii) shows the relationship between the amplitude and the frequency of the waveform of $F_{vco}$ in FIG. 1B(i).

FIGS. 2A and 2B are schematic illustrations showing an idealized spread spectrum, wherein FIG. 2A shows the relationship between frequency and time, while FIG. 2B shows the relationship between frequency and amplitude.

FIGS. 3A and 3B are schematic illustrations showing the spread spectrum when changing the frequency-divided value of a frequency-divided counter of the PLL, wherein FIG. 3A shows the relationship between frequency and time, while FIG. 3B shows the relationship between frequency and amplitude.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims. In certain instances, detailed descriptions of well-known devices and mechanisms are omitted so as to not obscure the description of the present invention with unnecessary detail.

Figure 1A:
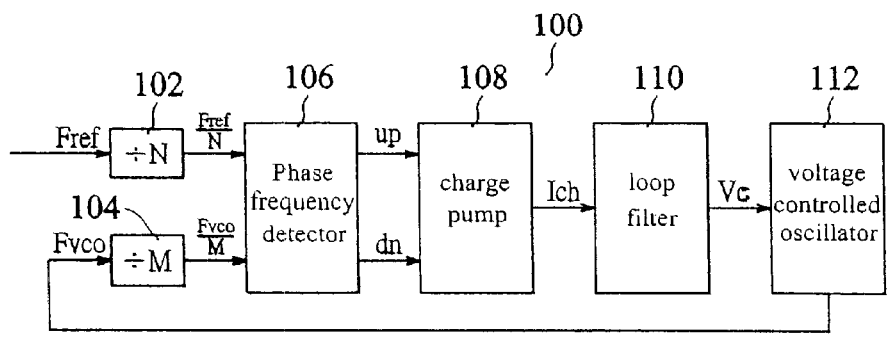
FIG. 1A is a primary block diagram showing a conventional phase-locked loop circuit.
Figure 1B:
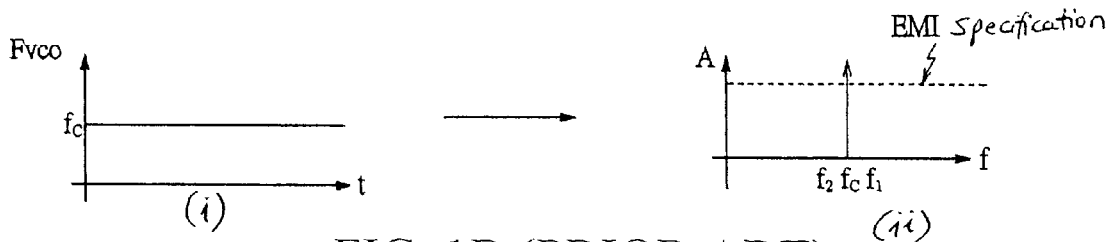
FIG. 1B(i) shows the waveform of $F_{vco}$ on the time-domain.
Figure 2:
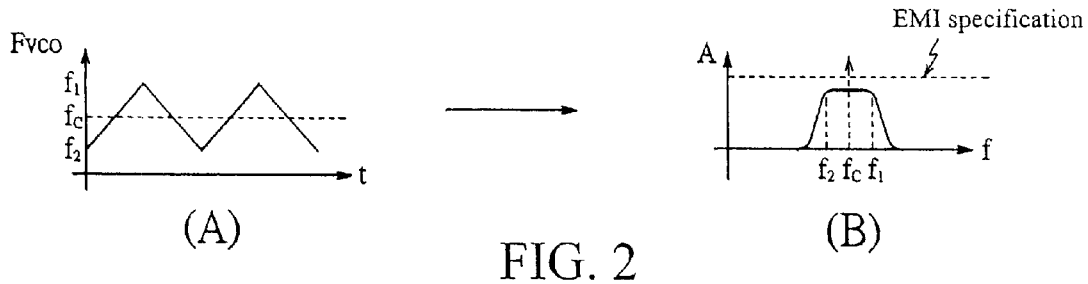
Figure 4:
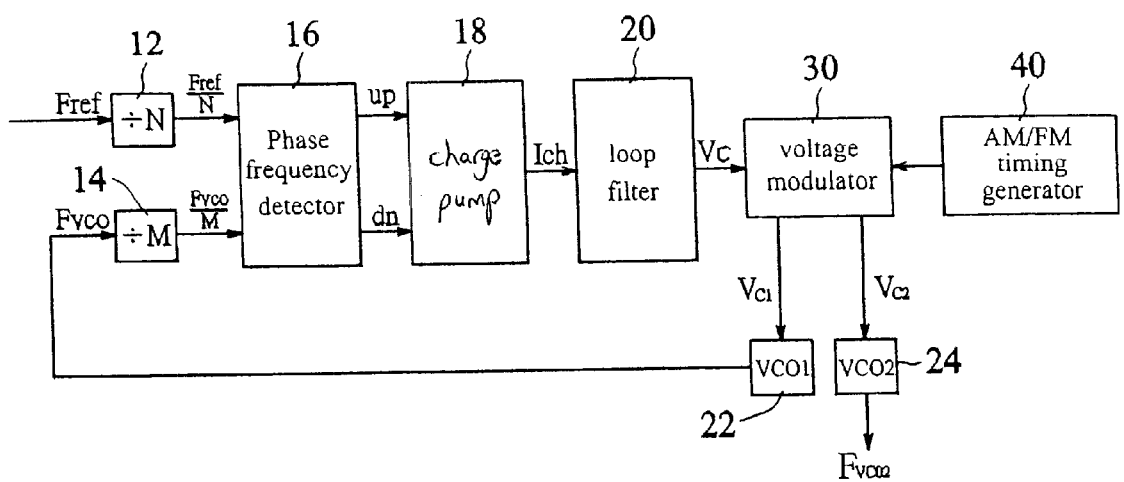
FIG. 4 is a block diagram showing a phase-locked loop circuit in accordance with one embodiment of the present invention.

FIG. 4 is a circuit block diagram showing a PLL circuit capable of adjusting the frequency range of spread spectrum clock in accordance with the preferred embodiment of the invention. As shown in FIG. 4, the PLL circuit 10 of the invention includes a N-divider 12, a M-divider 14, a phase frequency detector 16, a charge pump 18, a loop filter 20, a voltage modulator 30, a FM/AM timing generator 40, and voltage-controlled oscillators (VCO) 22 and 24. The basic idea is to use the voltage modulator 30 to control or manipulate the control voltages $V_{c1}$ and $V_{c2}$, as described in greater detail below. Since the capabilities and functions of the N-divider 12, M-divider 14, phase frequency detector 16, charge pump 18, loop filter 20, and voltage-controlled oscillators 22 and 24 are the same as those elements 102, 104, 106, 108 and 110 in FIG. 1, detailed description thereof will be omitted. The following detailed description will focus on the voltage modulator 30 and FM/AM timing generator 40.

The voltage modulator 30 in the PLL circuit 10 generates a first control voltage $V_{c1}$, and a second control voltage $V_{c2}$ that varies periodically. The first VCO 22 receives the first control voltage $V_{c1}$ and generates a stable feedback clock $F_{vco}$. The second VCO 24 receives the second control voltage $V_{c2}$ and generates a spread spectrum clock $F_{vco2}$. The structure of the first VCO 22 and the second VCO 24 can be the same. A timing control signal is generated from the FM/AM timing generator 40 for controlling the voltage modulator 30 to generate the second control voltage $V_{c2}$ that varies periodically.

The Voltage Modulator 30

Figure 5A:
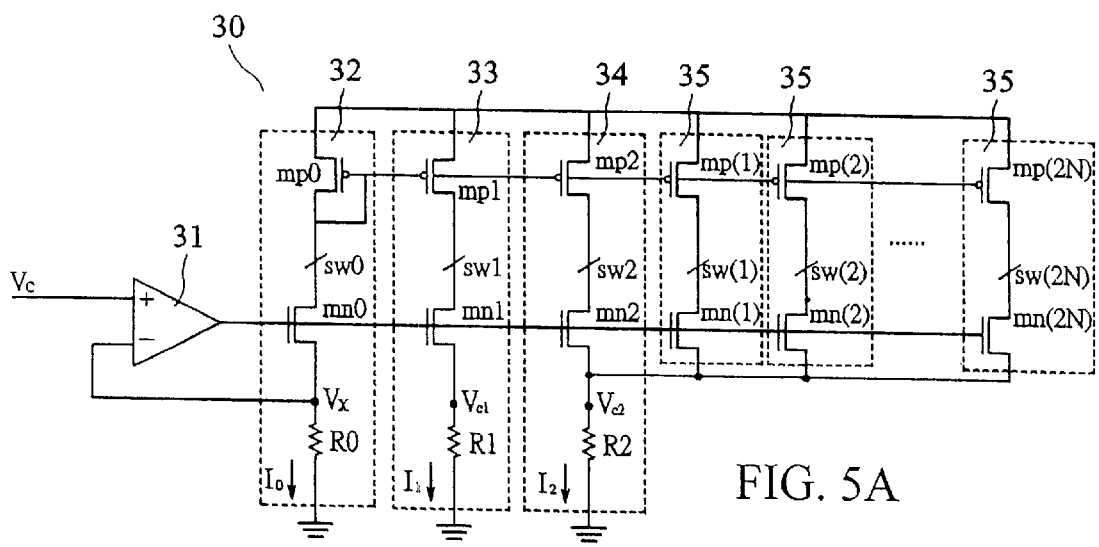
FIG. 5A is a circuit diagram of the voltage modulator in FIG. 4.

FIG. 5A is a circuit diagram showing the voltage modulator 30. As shown in FIG. 5A, the voltage modulator 30 includes an operational (OP) amplifier 31, a reference current trace 32, a first current trace 33, a second current trace 34, and 2N sets of third current traces 35. The reference current trace 32 consists of a transistor mp0, a switch sw0, a transistor mn0, and a resistor $R_0$ connected in series. The first current trace 33 consists of a transistor mp1, a switch sw1, a transistor mn1, and a resistor $R_1$ connected in series.

The second current trace 34 consists of a transistor mp2, a switch sw2, a transistor mn2, and a resistor $R_2$ connected in series. In addition, each of the third current traces 35 consists of a transistor mp(i), a switch sw(i), and a transistor mn(i) connected in series, wherein i=1 to 2N. The ratios of the width over the length (W/L) of the transistor dimension and the ratio of the width over the length (W/L) of the switches of the reference current trace 32, first current trace 33, second current trace 34, and third current traces 35 are:

$$mp0:mp1:mp2:mp(i)=1:1:(1-N\delta): \delta \qquad (1)$$

$$mn0:mn1:mn2:mn(i)=1:1:(1-N\delta): \delta \qquad (2)$$

$$sw0:sw1:sw2:sw(i)=1:1:(1-N\delta): \delta \qquad (3)$$

wherein δ is a very small value, equivalent to the smallest adjustable unit (e.g., 0.01 to 0.001), and N is an adjustable variable. Furthermore, the values of the resistors $R_0$, $R_1$, and $R_2$, have to be the same. The voltage across the resistor $R_1$ is defined as the first control voltage $V_{c1}$ while the voltage across the resistor $R_2$ is defined as the second control voltage $V_{c2}$.

As shown in FIG. 5A, the output voltage $V_c$ from the loop filter 20 is connected to the positive terminal of the OP amplifier 31 of the voltage modulator 30, and the output of OP amplifier 31 is connected to the gate of the transistor mn0, with the negative terminal of the OP amplifier 31 connected to the source of the transistor mn0. Because the OP amplifier 31 is in negative feedback condition, the output voltage $V_c$ should be the same as $V_X$. Then, the current of the reference current trace 32 is mirrored to the first current trace 33, the second current trace 34, and the 2N sets of third current traces 35 using the known technique of current mirroring, and the voltages $V_{c1}$ and $V_{c2}$ are generated by the resistors $R_1$ and $R_2$. Thus, the voltages of $V_{c1}$, $V_X$ and $V_c$ are the same, and the current flowing through resistor R1 can be defined by the equation $I_1=V_{c1}/R_1$. The current flowing through resistor $R_2$ can be defined by the equation $I_2=I_1(1-N\delta+X\delta)$, wherein "X" is the conductive trace number of the 2N sets of third current traces 35, and is between 1 and 2N. Therefore:

$$\begin{aligned}V_{c2} &= R_2 I_2 \\ &= R_1 I_1(1 - N_\delta + X_\delta) \\ &= V_{c1}(1 - N_\delta + X_\delta) \\ &= V_x(1 - N_\delta + X_\delta)\end{aligned}$$

Thus, the frequency difference between the clocks $F_{vco1}$ and $F_{vco2}$ are defined as $F_{vco1}-F_{vco2}=K_{vco}V_x(N-X)$ δ, and delta $f=K_{vco}V_x$ δ is defined to be the minimum programmable frequency step. Consequently, the frequency of clock $F_{vco2}$ generated by VCO 24 can be periodically controlled between ($F_{vco1}$+X*delta f) and ($F_{vco1}$−X*delta f), as long as the "ON" state of each switch sw(i) can be periodically controlled. The clock $F_{vco2}$ can be modulated by AM modulation or FM modulation or combined AM/FM modulation techniques, as described hereinbelow.

Figure 5B:
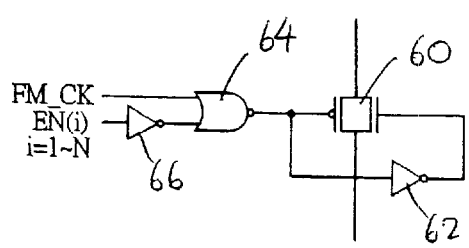
FIGS. 5B and 5C are circuit diagrams of the switches in the voltage modulator of FIG. 4.
Figure 5C:
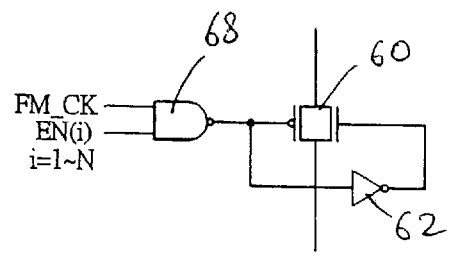

The switch sw(i) can be embodied in one of two different circuits. FIGS. 5B and 5C each illustrates a different circuit for the switch sw(i) in FIG. 5A. The switches from sw(1) to sw(N) are shown in FIG. 5B, and the switches from sw(N+1) to sw(2N) are shown in FIG. 5C. Operation of the switches sw(1) to sw(2N) will be described in greater detail below.

The switches sw0, sw1 and sw2 in current traces 32, 33 and 34 are always kept in the "ON" state, for matching with the switches sw(i). Each switch sw(i) is controlled by two control signals FM_CK and EN(i) that are outputted from the AM/FM timing generator 40. If only AM modulation is to be used to control the clock $F_{vco2}$, then the signal FM_CK is set as a timing signal with a constant frequency. If only FM modulation is to be used to control the clock $F_{vco2}$, then EN(1)-EN(N) is set to a constant value. If both AM and FM modulation are to be used to control the clock $F_{vco2}$, then the signal FM_CK is set as a timing signal with varying frequencies.

The switch circuit in FIG. 5B has a transmission gate 60 having an NMOS gate that is coupled to the output of an inverter 62. A NOR gate 64 has one input coupled to the FM_CK signal, and another input coupled to the output of an inverter 66, whose input is coupled to the signal EN(i). The output of the NOR gate 64 is coupled to the PMOS gate of the transmission gate 60 and the input of inverter 62. According to the circuit in FIG. 5B, when the signal FM_CK is 1, all the switches from sw(1) to sw(N) are turned on. However, when the signal FM$_{\_CK\ is}$ 0, only the switches from among sw(1) to sw(N) in which the control signal EN(i) is 0 are turned on.

The switch circuit in FIG. 5C also has a transmission gate 60 having an NMOS gate that is coupled to the output of an inverter 62. A NAND gate 68 has one input coupled to the FM_CK signal, and another input coupled to the signal EN(i). The output of the NAND gate 68 is coupled to the PMOS gate of the transmission gate 60 and the input of inverter 62. According to the circuit in FIG. 5C, when the signal FM_CK is 0, all the switches from sw(N+1) to sw(2N) are turned off. However, when the signal $FM_{13}$ CK is 1, only the switches from among sw(N+1) to sw(2N) in which the control signal EN(i) is 1 are turned on. In light of the operation of the switch circuits illustrated in FIGS. 5B and 5C, the number of switches sw(1) to sw(2N) that are turned on can be controlled periodically by varying the signals FM_CK and EN(i).

Control of the Clock $F_{vco2}$ by AM/FM

There are various ways for implementing the present invention, such as the use of AM (amplitude modulation) control, FM (frequency modulation) control, and AM/FM control.

Figure 3:
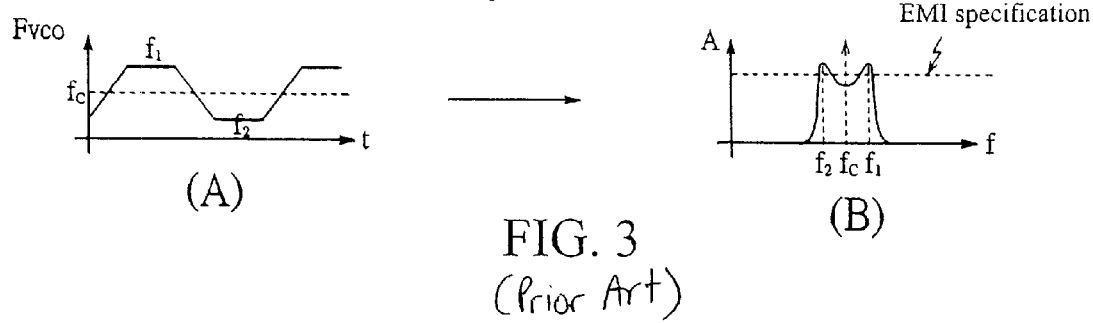
Figure 6A:
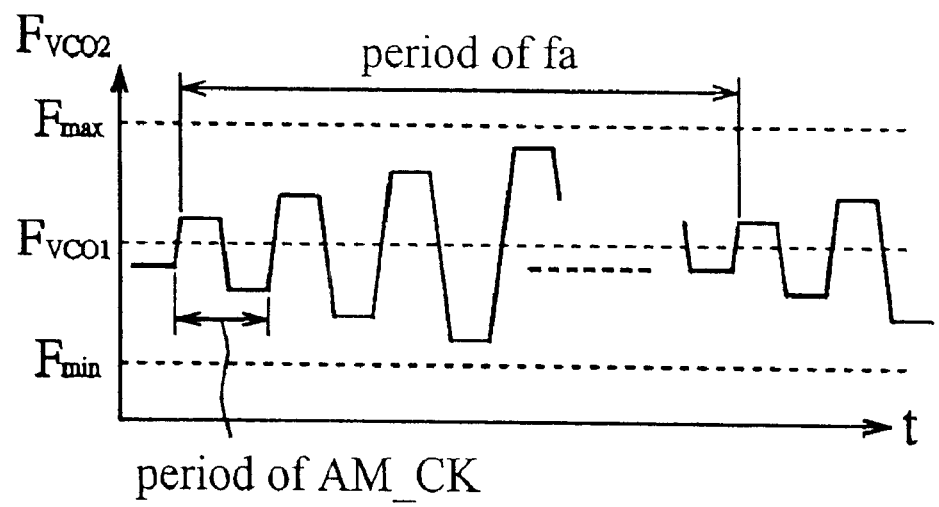
FIG. 6A shows the waveform of $F_{vco2}$ on the time-domain.
Figure 6B:
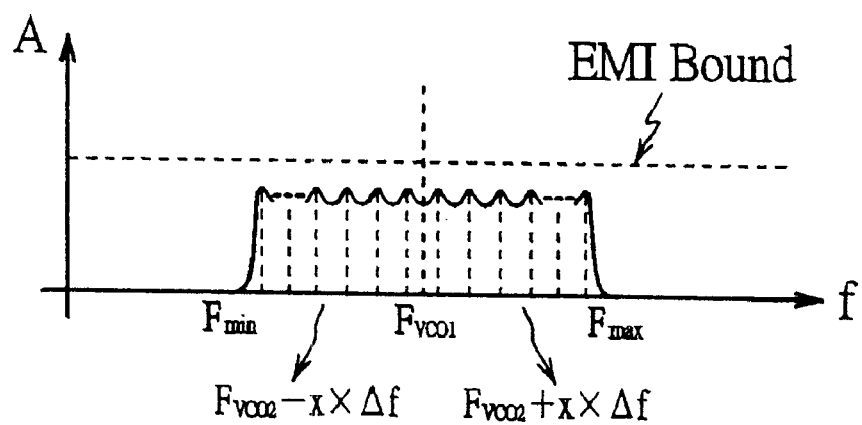
FIG. 6B shows the waveform of $F_{vco2}$ on the frequency-domain.

The use of AM modulation to control the clock $F_{vco2}$ is described as follows. In this case, the signal $FM_{13}$ CK in FIGS. 5B and 5C is set as a timing signal with a constant frequency. The $FM_{13}$ CK signal is also connected as signal AM-CK in FIG. 8B. Therefore, in the case that there are X bits of 1 among the signal EN(i), when the signal $FM_{13}$ CK is 1, it will be known that the frequency $F_{vco2}=(F_{vco1}+$X*delta f). On the other hand, when the signal $FM_{13}$ CK is 0, it will be known that the frequency $F_{vco2}=(F_{vco1}-$X*delta f). This can be obtained by understanding the following. There are X bits of "1" among the signal EN(i), with i=1 to N. Thus, when the signal FM_CK is "0" (i.e., low), switches sw(1) to sw(N) will only have (N−X) switches "on", and switches sw(N+1) to sw(2N) are all "off". Similarly, when the signal FM_CK is "1" (i.e., high), switches sw(1) to sw(N) are all "on", and switches sw(N+1) to sw(2N) will only have X switches "on". Consequently, as long as X (i.e., the number of bits of the signal EN(i) that have a 1 value) is periodically modulated, the frequency $F_{vco2}$ is also periodically varied within a predetermined frequency range, thereby eliminating the jutting phenomenon shown in FIG. 3B. FIG. 6A illustrates the waveform of the frequency $F_{vco2}$ varying periodically in the time domain, and FIG. 6B illustrates the waveform of the frequency $F_{vco2}$ varying periodically in the frequency domain. FIGS. 6A and 6B only illustrate one non-limiting embodiment. Thus, the effect of a spread spectrum clock can be achieved as long as X is periodically varied.

Figure 7A:
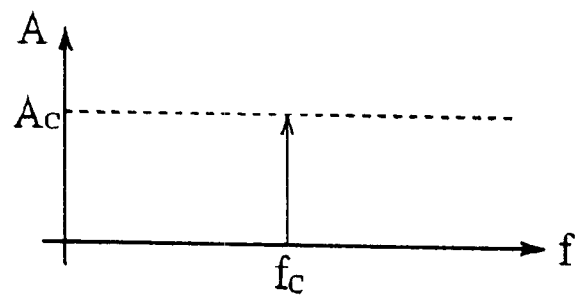
FIG. 7A shows the waveform of the frequency spectrum of $X_0(t)=A_c \cos(2\pi*f_c t+Q_c)$
Figure 7B:
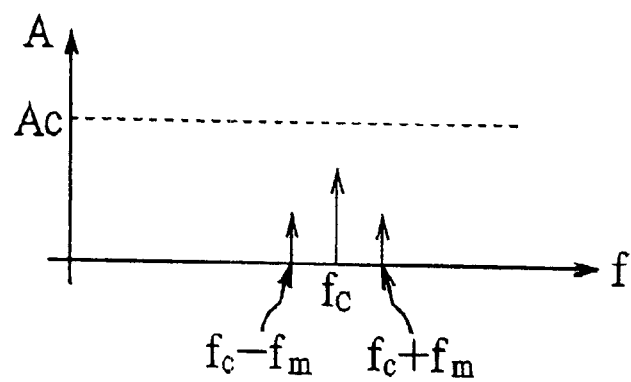
FIG. 7B shows the waveform of the frequency spectrum of $X_c(t)=A_c \cos(2\pi*f_c t+Q_c)$ after narrowband modulation.
Figure 7C:
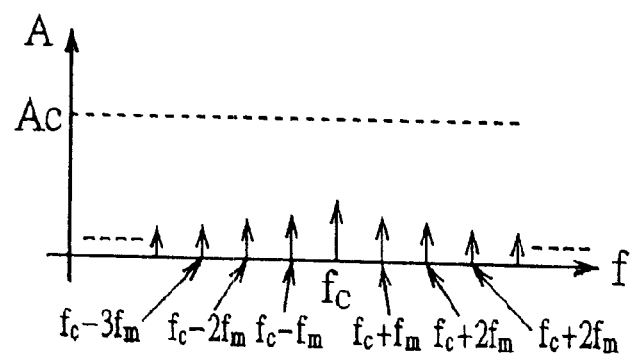
FIG. 7C shows the waveform of the frequency spectrum of $X_c(t)=A_c \cos(2\pi*f_c t+Q_c)$ after broadband modulation.
Figure 7D:
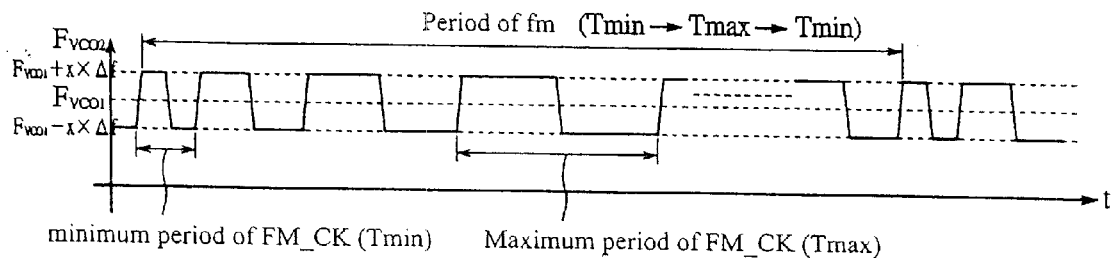
FIG. 7D shows the waveform of FM_CK.
Figure 7E:
FIG. 7E shows the waveform of the frequency spectrum after FM modulation.

The use of FM modulation to control the clock $F_{vco2}$ is described as follows. In this case, the signal $FM_{13}$ CK in FIGS. 5B and 5C is set as a timing signal with varying frequencies. The signal $FM_{13}$ CK can be generated by using the circuit illustrated in FIG. 8A, where CK_F is a reference clock signal. There are X bits of "1" from among the signals EN(i), with i=1 to N. Assume that there is a sinusoidal signal $X_c(t)=A_c \cos(2\pi*f_c t+Q_c)$, wherein $A_c$ is the amplitude, $f_0$ is the center frequency, and $Q_c$ is the phase angle (assumed to be a constant value). The graph shown in FIG. 7A is the representation of $X_c(t)$ in the frequency spectrum. If the center frequency $f_c$ of $X_c(t)$ is changed by a modulation signal and the modulation frequency for modulating $f_c$ is $f_m$, then when $f_m$ is much smaller than $f_c$, this case is called a narrowband FM modulation. FIG. 7B shows the narrowband modulation of $X_c(t)$, where there are some signals generated at $f_c$, $f_c+f_m$, and $f_c-f_m$, and the amplitude of each of the signals is smaller than $A_c$. Other high-order harmonic components can be omitted. When $f_m$ is not much smaller than $f_c$, this case is called a broadband FM modulation. FIG. 7C shows the broadband modulation of $X_c(t)$. In FIG. 7C, there are also some signals generated at $f_c+nf_m$, $f_c-nf_m$, and the amplitude of each of the signals is also smaller than $A_c$, wherein n is an integer. The control principle of FM modulation is to make some changes to the period of the signal $FM_{13}$ CK, so as to modulate the staying time of clock $F_{vco2}$ staying between the frequencies ($F_{vco1}$+X*delta f) and ($F_{vco1}$−X*delta f). As shown in FIG. 7D, the period of the signal $FM_{13}$ CK varies from the minimum to the maximum, and from the maximum to the minimum. In other words, the period of the signal $FM_{13}$ CK varies periodically. Consequently, as shown in FIG. 7E, the frequency $F_{vco2}$ is distributed at each of the frequency spectrums of $F_{vco1}$+nfm and $F_{vco1}$−$nf_m$. However, the amplitude of each signal is smaller than the upper bound of EMI. Since the frequency $F_{vco2}$ still stays between the frequencies ($F_{vco1}$+X*delta f) and ($F_{vco1}$−X*delta f) for a period of time, the jutting phenomenon of FIG. 3B still exists at the position of frequencies $F_{vco1}$+$nf_m$ and $F_{vco1}$−$nf_m$.

Figure 7F:
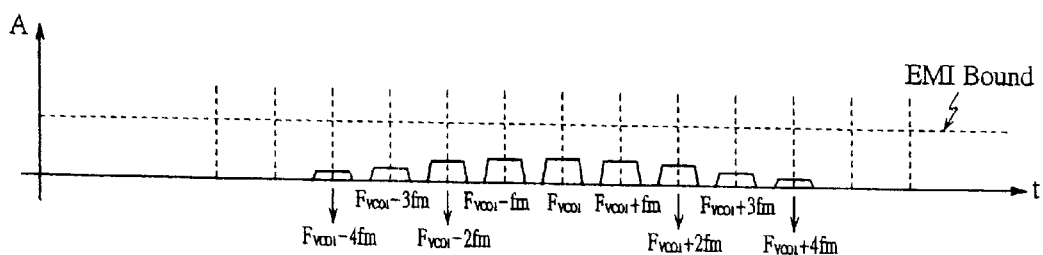
FIG. 7F shows the waveform of the frequency spectrum after FM/AM modulation.

As a result, AM modulation control can be used if it is desired to effectively eliminate the jutting phenomenon on the frequency spectrum, while the FM modulation control can be used if it is primarily desired to spread the energy over a much wider range. FIG. 7F shows the result obtained by combining AM and FM modulation control, where the jutting phenomenon is eliminated, and the energy can also be spread over a much wider range.

Given the above description, it can be understood as to why there are a total of 2N switches sw(i). From FIG. 5A, if half of the switches sw(i) are opened or closed, the currents $I_2=I_2=I_0$ because of the existence of the current mirror.

The FM/AM Timing Generator

Figure 8A:
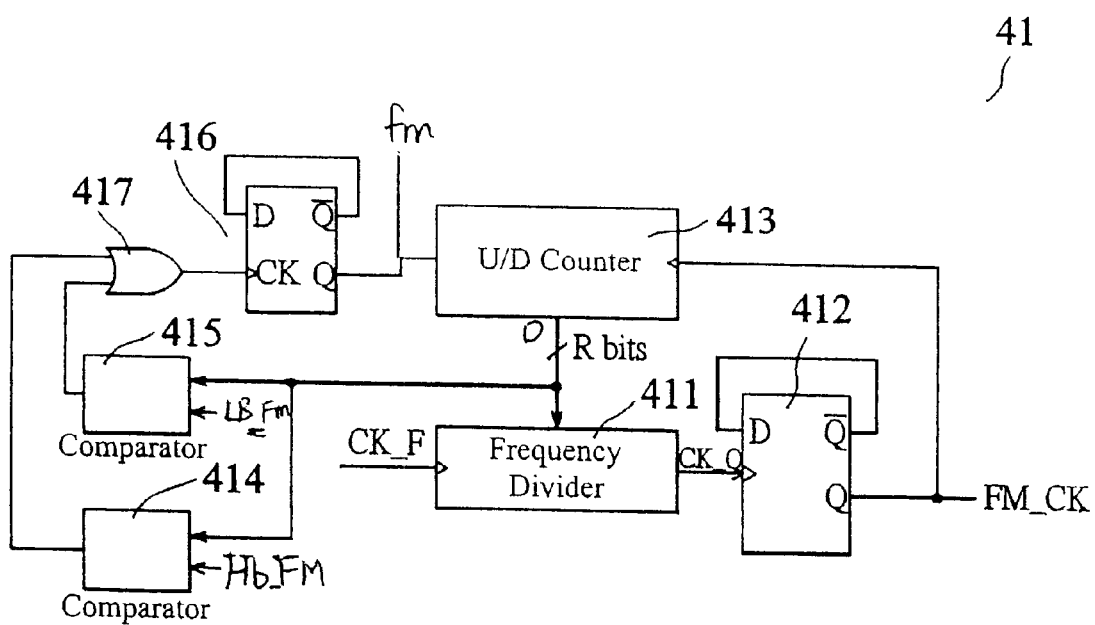
FIG. 8A is a circuit diagram of the FM controller of the FM/AM timing generator in FIG. 4.
Figure 8B:
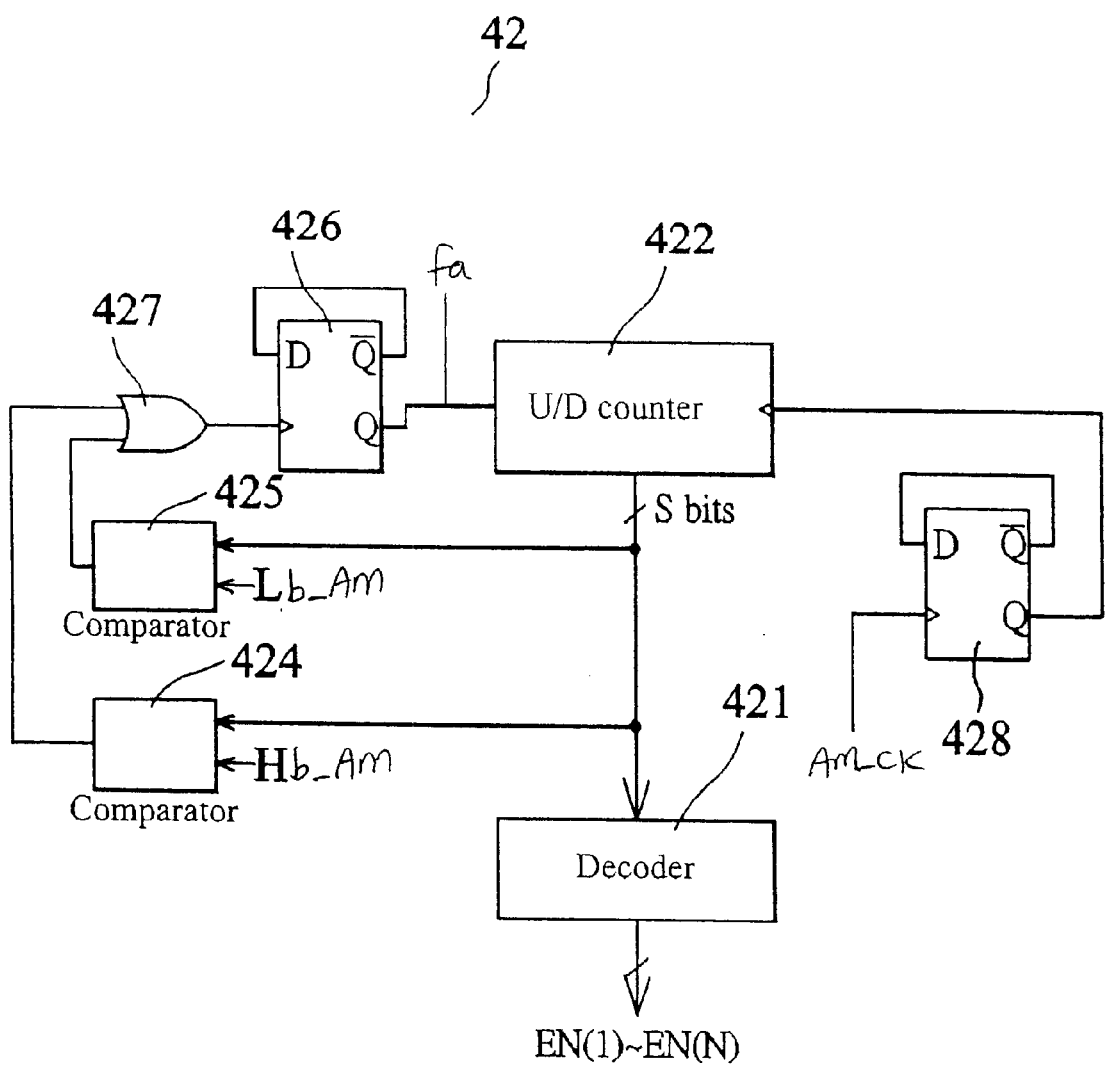
FIG. 8B is a circuit diagram of the AM controller of the FM/AM timing generator in FIG. 4.

FIGS. 8A and 8B are circuit diagrams illustrating the FM/AM timing generator 40. As shown in FIGS. 8A and 8B, the timing generator 40 includes two parts, one of which is a FM generator 41 (FIG. 8A) for generating a FM timing signal $FM_{13}$ CK, and the other of which is an AM generator 42 (FIG. 8B) for generating an AM timing signal AM_CK. If FM and AM modulation are combined, the signal $FM_{13}$ CK in FIG. 8A will be connected to the signal AM CK in FIG. 8B.

In the FM generator 41 as shown in FIG. 8A, a frequency divider 411 is provided for generating a frequency-divided signal CK_O from a reference frequency CK_F that has a fixed period. A flip-flop 412 is triggered by the frequency-divided signal CK_O, and a FM timing signal $FM_{13}$ CK whose duty cycle is 50% is then generated from the Q output of the flip-flop 412. The flip-flop 412 essentially operates as a duty-cycle controller to ensure the signal "high" time is equal to the signal "low" time. The FM timing signal $FM_{13}$ CK is a modulated clock, and can be used for controlling the switching (ON/OFF) frequency of each of the switches sw(1) to sw(2N). A counter 413 has an input coupled to the FM timing signal $FM_{13}$ CK, and outputs a divisor (D) to the frequency divider 411 and two comparators 414 and 415. This divisor (D) can be incremented during each iteration, so that the division by, for example 2, becomes division by 3 during the next iteration. Since the counter 413 is triggered by the positive-edge of the FM timing signal $FM_{13}$ CK to change its counting value, and the divisor D of the frequency divider 411 is provided by the counter 413, the FM generator 41 is capable of generating FM timing signals $FM_{13}$ CK having different periods as the output value of the counter 413 changes. In addition, the comparators 414 and 415 are provided for comparing the counting value (i.e., the divisor D) with the counting bounds Hb_FM and Lb_FM, and for determining whether the counting value exceeds the counting bounds or not. The output signals of the comparators 414 and 415 are transformed into UP/DOWN control signals (i.e., to increase or decrease the bounds) for the counter 413 by way of an OR gate 417 and a flip-flop 416. The flip-flop 416 functions as a time delay to prevent glitch, and controls the direction of the counter 413. Thus, the desired FM timing signal $FM_{13}$ CK can be generated by the FM generator 41 as long as the desired UP/DOWN counting bounds Hb_FM and Lb_M can be programmed. The maximum period $T_{max}$ and minimum period $T_{min}$ of $FM_{13}$ CK are defined by the values of Hb_FM and LbFM, and the frequency defined from $T_{max}$ to $T_{min}$ and from $T_{min}$ to $T_{max}$ is $f_m$.

In the AM generator 42 shown in FIG. 8B, a decoder 421 is used for decoding the output value of a counter 422 and generating N sets of the signal EN(i). In other words, the decoder 421 determines which range of switches sw(i) to open. When the output value of the counter 422 is j, there should be j bits of 1 in the signal EN(i). As described above, the signals EN(i) are used for controlling the number of switching operations of the switches sw(1) to sw(2N). The counter 422 is triggered by the Q output from the flip-flop 428, and the flip-flop 428 is triggered by a clock AM_CK. The flip-flop 428 also functions as a duty-cycle controller. The frequency of the clock AM_CK is constant if only AM modulation is used (and the circuit of FIG. 8A will not be used during AM modulation only), and can be coupled to $FM_{13}$ CK from the FM generator 41 in FIG. 8A if AM and FM modulation is combined. In addition, comparators 424 and 425 are provided for comparing the counting value (outputted from the counter 422) with the UP/DOWN counting bounds Hb_AM and Lb_AM, and for determining whether the counting value exceeds the counting bounds or not. The output signals of the comparators 424 and 425 are transformed into UP/DOWN control signals for the counter 422 by way of an OR gate 427 and a flip-flop 426. Thus, the desired AM timing signals EN(1) to EN(N) can be generated by the AM generator 42 as long as the desired UP/DOWN counting bounds Hb_AM and Lb_M can be programmed. The maximum frequency $F_{max}$ and minimum frequency $F_{min}$ of $F_{vco2}$ are defined by the values of Hb_Am and Lb_Am, and the frequency defined from $F_{max}$ to $F_{min}$ and from $F_{min}$ to $F_{max}$ is $f_a$. Thus, N sets of signal EN(i) generated by the AM generator 42 can be outputted to two sets (i.e., sw(1)-sw(N) and sw(N+1)-sw(2N)) of switches sw(i) of the voltage modulator 30.

Thus, the so-called AM control is to set the timing signal $FM_{13}$ CK in FIGS. 5B and 5C to be a signal with a constant frequency and to connect $FM_{13}$ CK to the clock signal AM_CK in FIG. 8B, so as to periodically change the number of 1's in EN(i). In essence, AM control will determine the range of switches sw(i) to be controlled (open or close) by $FM_{13}$ CK. The so-called FM control is to use the FM generator 41 to output the timing signal $FM_{13}$ CK with varying periods, and to make one set of signal EN(i) constant. The signal $FM_{13}$ CK in FIGS. 5B and 5C is a period-varying signal, and EN(i) has a fixed number of 1's. In essence, FM control will control or determine the time of the opening or closing of switches sw(i) in a selected range, as well as other parameters. The so-called AM/FM control is to combine the AM control with the FM control, output the timing signal $FM_{13}$ CK with varying periods by the FM generator 41, and output the EN(i) signal with varying periods by the AM generator 42. At the same time, the timing signal $FM_{13}$ CK can serve as the clock AM_CK of the AM generator 42 for AM/FM modulation control. Consequently, the jutting phenomenon of the spread spectrum clock can be eliminated, and the energy of the spread spectrum clock can also be spread over a much wider range.

The data of Hb_FM, Lb_FM, Hb_AM, and Lb_AM can be stored in the memory on the motherboard, and the desired data can be outputted to the FM/AM timing generator 40 using program software, so that the present invention is capable of controlling spread spectrum in a programmable way.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A phase-locked loop circuit, comprising:
    a first voltage-controlled oscillator (VCO) that generates a feedback clock;
    a phase frequency detector that receives a reference clock and the feedback clock, and in response thereto generates a first control signal that is dependent upon the phase difference and the frequency difference between the reference clock and the feedback clock;
    a charge pump that receives the first control signal from the phase frequency detector;
    a loop filter coupled to the charge pump to generate a first voltage signal;
    a timing generator that generates a second control signal having varying periods;
    a voltage modulator that receives the first voltage signal and the second control signal, and in response thereto generates a second voltage signal and a third voltage signal, with the second voltage signal provided to the first VCO; and
    a second VCO that receives the third voltage signal and which outputs a spread spectrum clock.

2. The circuit of claim 1, further including a first frequency divider that receives the reference clock and is coupled to the phase frequency detector, wherein the first frequency divider lowers the frequency of the reference clock to 1/N.

3. The circuit of claim 1, further including a second frequency divider that receives the feedback clock and is coupled to the phase frequency detector, wherein the second frequency divider lowers the frequency of the feedback clock to 1/M.

4. The circuit of claim 1, wherein the voltage modulator includes:
    an OP amplifier having a positive terminal that receives the first voltage signal, and a negative terminal;
    a reference current trace having a first transistor, the first transistor having a gate coupled to the OP amplifier, and a source coupled to the negative terminal of the OP amplifier;
    a first current trace having a second transistor forming a current mirror with the first transistor of the reference current trace;
    a second current trace having a third transistor forming a current mirror with the first transistor of the reference current trace; and
    2N sets of third current traces, each of the third current traces having a fourth transistor forming a current mirror with the first transistor of the reference current trace.

5. The circuit of claim 4, wherein the 2N sets of third current traces are controlled by 2N sets of switches.

6. The circuit of claim 4, wherein:
    the reference current trace includes a first resistor that is coupled to the source of the first transistor;
    the second transistor of the first current trace outputs current to a second resistor;
    the third transistor of the second current trace outputs current to a third resistor; and
    each of the fourth transistors of the third current traces outputs current to the third resistor.

7. The circuit of claim 4, wherein the width/length ratio of the first, second, third and fourth transistors is $1:1:(1-N\delta):\delta$.

8. The circuit of claim 7, wherein the resistances of the first, second, third and fourth transistors are the same.

9. The circuit of claim 6, wherein the voltage across the second resistor is the second voltage signal.

10. The circuit of claim 6, wherein the voltage across the third resistor is the third voltage signal.

11. The circuit of claim 5, wherein the reference current trace is controlled by a first switch, the first current trace is controlled by a second switch, and the second current trace is controlled by a third switch.

12. The circuit of claim 11, wherein the first, second and third switches are always turned on.

13. The circuit of claim 12, wherein the width/length ratio of the first, second and third switches, and each of the switches in the third current traces, is $1:1:(1-N\delta):\delta$.

14. The circuit of claim 5, wherein the 2N sets of switches are comprised of first and second groups of switches, each group of switches having a different structure and are controlled by a frequency modulation control signal and a N-bit amplitude modulation control signal at the same time.

15. The circuit of claim 14, wherein when the first control signal is 1 and X bits of the second control signal are 1, the first group of switches are all turned on, and the number of the second group of switches which are turned on is X.

16. The circuit of claim 14, wherein when the first control signal is 0 and X bits of the second control signal are 1, the second group of switches are all turned on, and the number of the first group of switches which are turned on is (N-X).

17. The circuit of claim 1, wherein the timing generator includes:
    a FM control signal generator for generating a FM control signal that varies periodically; and
    an AM control signal generator for generating an AM control signal that varies periodically.

18. A circuit that receives a reference clock, and includes:

a first voltage-controlled oscillator (VCO) that generates a feedback clock;

a phase frequency detector, a charge pump and a loop filter that together receives the reference clock and the feedback clock, and in response thereto generates a first voltage signal;

a timing generator that generates a control signal having varying periods;

a voltage modulator that receives the first voltage signal and the control signal, and in response thereto generates a second voltage signal and a third voltage signal, with the second voltage signal provided to the first VCO; and a second VCO that receives the third voltage signal and which outputs a spread spectrum clock.

* * * * *